(12) United States Patent
Carter

(10) Patent No.: US 6,963,244 B1
(45) Date of Patent: Nov. 8, 2005

(54) COMMON MODE LINEARIZED INPUT STAGE AND AMPLIFIER TOPOLOGY

(75) Inventor: Nathan R. Carter, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 80 days.

(21) Appl. No.: 10/736,110

(22) Filed: Dec. 12, 2003

(51) Int. Cl.[7] .............................................. H03F 3/45
(52) U.S. Cl. ........................ 330/252; 330/257; 330/261
(58) Field of Search ................................ 330/252, 254, 330/257, 258, 261

(56) References Cited

U.S. PATENT DOCUMENTS

| | | | | |
|---|---|---|---|---|
| 5,214,329 A | | 5/1993 | Furino, Jr. | .................. 307/491 |
| 5,323,120 A | * | 6/1994 | Ryat | ........................... 330/252 |
| 5,859,566 A | * | 1/1999 | Voorman et al. | ............ 330/252 |
| 6,486,737 B1 | * | 11/2002 | Carter | ........................ 330/257 |

OTHER PUBLICATIONS

"The Multi-tanh Principle, A Tutorial Overview", Barrie Gilbert, IEEE Journal of Solid-State Circuits, vol. 33, No. 1, Jan. 1998, pp. 2-17.

If Amplifiers For Monolithic Bipolar Communications Systems, Barrie Gilbert, Analog Devices, Inc. 1996, pp. 36-37.

* cited by examiner

Primary Examiner—Steven J. Mottola
(74) Attorney, Agent, or Firm—Koppel, Jacobs, Patrick & Heybl (57) ABSTRACT

A common mode linearized input stage comprises NPN and PNP differential pairs biased with respective tail currents at respective common emitter nodes, with each pair connected to receive a differential input signal. A tail current modulation circuit generates complementary output currents as a function of the voltage difference between the common emitter nodes, and first and second tail current sources generate the tail currents as a function of the complementary output currents. The tail current modulation circuit and the first and second tail current sources are arranged such that the magnitudes of the tail currents increase with an increasing differential input signal.

28 Claims, 9 Drawing Sheets

COMMON MODE LINEARIZED INPUT STAGE AND AMPLIFIER TOPOLOGY

BACKGROUND OF THE INVENTION

1. Field of the Invention

This invention relates to the field of operational amplifiers (op amps) input stages, and particularly to common mode linearized input stages.

2. Description of the Related Art

The open loop gain of an op amp decreases with increasing input signal frequency. This requires that a larger error signal appear across the amplifier's input for signals of a given amplitude and increasing frequency. This, in turn, requires the op amp to have a large linear input range; if the input range is insufficient, distortion will result.

A bipolar differential transistor pair has a highly nonlinear input range. One way to extend the linear portion of a bipolar pair's input range is with the use of degeneration resistors. However, the use of degeneration resistors can result in noise degradation, as well as loss of headroom.

Another approach to extending linear input range requires the use of class AB-type input stages. Unfortunately, such stages are also known to increase noise and lower precision.

Figure 1:
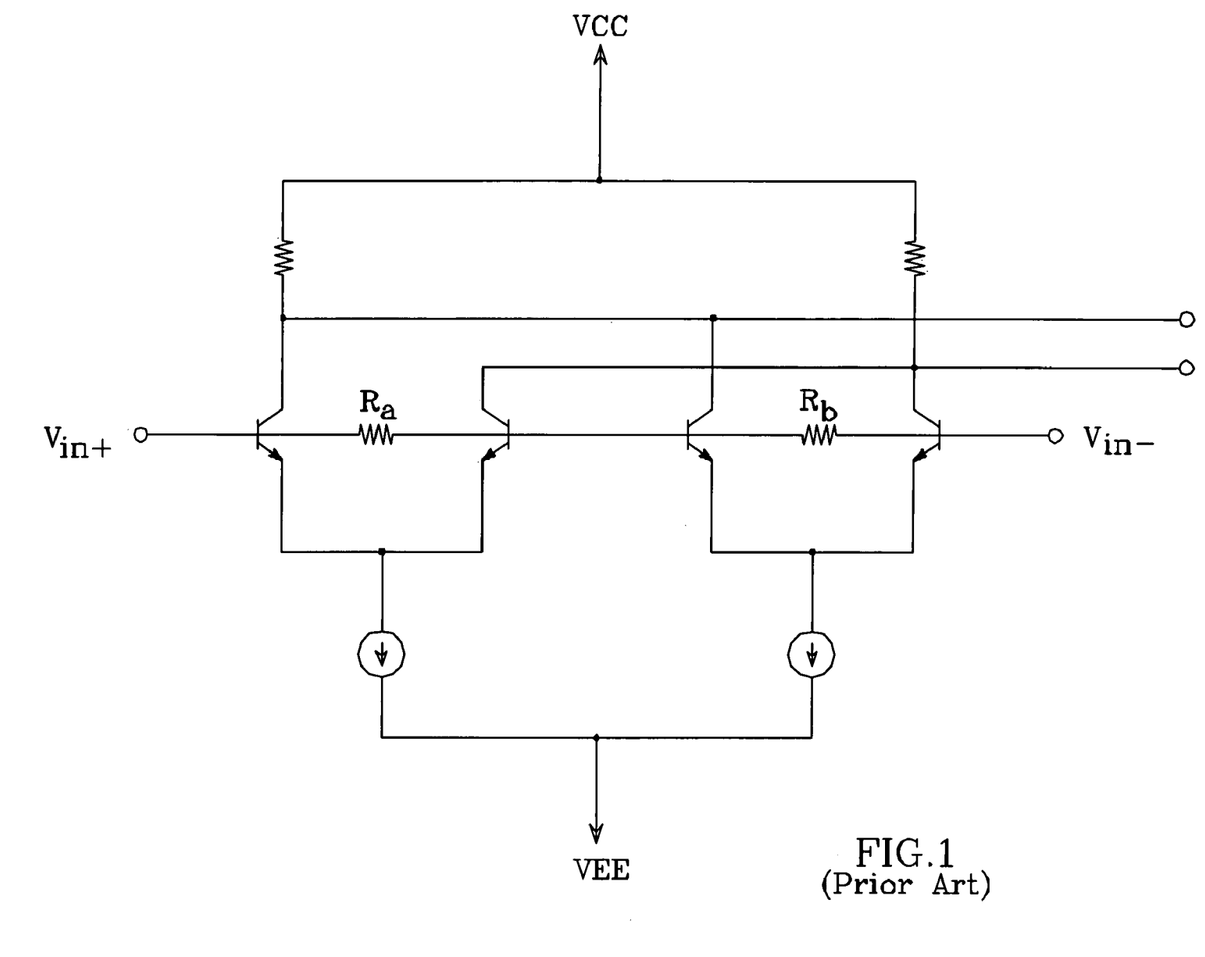
FIG. 1 is a schematic diagram of a prior art series-connected doublet.

Yet another approach to extending linear input range is to use a series-connected doublet configuration which employs the "multi-tanh principle", as described, for example, in *Gilbert*, IEEE Journal of Solid-State Circuits, Volume 33, Issue 1, January 1998, pp. 2–17. Here, individual nonlinear (hyperbolic tangent, or tanh) transconductance functions can be separated along the input-voltage axis to achieve a much more linear overall function. A typical implementation is shown in FIG. 1. However, though this arrangement extends the linear input range, it requires dividing resistors $R_a$ and $R_b$ between its inputs.

An op amp's linear input range can also be affected by manipulating its tail currents. One tail-current modulating approach is described in U.S. Pat. No. 5,214,329 to Furino, Jr. Here, the amplifier's bias currents are modulated as a function of the differential input voltage. However, Furino modulates bias currents through a direct measurement of differential input voltage, which can add current noise and offset current to the differential inputs.

SUMMARY OF THE INVENTION

A common mode linearized input stage and an amplifier topology are presented which overcome the problems noted above, providing a large linear input range, fast slew rate, and low noise.

The present input stage comprises an NPN differential transistor pair having its emitters connected together at a first common node, and its bases connected to receive a differential input signal. Similarly, a PNP differential transistor pair has its emitters connected together at a second common node, and its bases connected to the differential input signal. The NPN and PNP differential pairs are biased with respective tail currents provided to the first and second common nodes by first and second tail current sources, respectively.

The input stage includes a tail current modulation circuit which generates complementary output currents as a function of the voltage difference between the first and second common nodes. The first and second tail current sources are connected to receive respective complementary output currents, and are arranged to generate their respective tail currents as a function of their complementary output currents.

The tail current modulation circuit is arranged to reduce the magnitude of the tail currents provided to the differential transistor pairs when the differential input signal is zero, and to allow the tail currents to increase with an increasing differential input signal. When properly arranged, this technique serves to extend the input pairs' linear input range.

The tail current modulation circuit preferably comprises a PNP diversion transistor having its base connected to the first common node, its collector coupled to the first tail current source, and its emitter connected to a third common node, and a NPN diversion transistor having its base connected to the second common node, its collector coupled to the second tail current source, and its emitter connected to the third node. The PNP and NPN diversion transistors conduct and thereby divert the first and second tail currents from the NPN and PNP differential transistor pairs, respectively, when the differential input signal is zero—with the tail currents being reduced by a scaling factor set by the ratio of the diversion transistors' emitter size to the input pairs' emitter size. However, in the presence of a non-zero differential input signal, the NPN and PNP differential pairs pull the voltages at the first and second common nodes closer together, which eventually turns off the diversion transistors and allows the full tail currents to flow through the input pairs. In addition to linearizing the input stage, this arrangement provides a substantial increase in slew rate over a simple differential pair having a comparable transconductance. In addition, all current noise from the diversion transistors is common mode, as is noise generated by the tail current sources that drive the input devices. In addition, the early voltage of the diversion transistors track with the differential input pairs, resulting in increased power supply rejection ratio (PSRR) and common mode rejection ratio (CMRR). The scaling factor can also be selected such that the input stage decompresses the differential input signal, to compensate for possible compression caused by later stages within the amplifier.

The present input stage produces differential output currents, which are preferably coupled to an input stage mirroring structure. The differential output currents are provided to complementary mirrors that are fed by a single floating current source and produce a single-ended output current. Noise due to the current source is correlated for the two mirrors, such that its noise sums to zero at the output. The present input stage is connected to the mirroring structure in a balanced fashion, so that an equal current on both sides of the mirror causes the mirrors to shift up and down without changing the output current—thereby rejecting common mode noise.

Further features and advantages of the invention will be apparent to those skilled in the art from the following detailed description, taken together with the accompanying drawings.

DETAILED DESCRIPTION OF THE INVENTION

Figure 2:
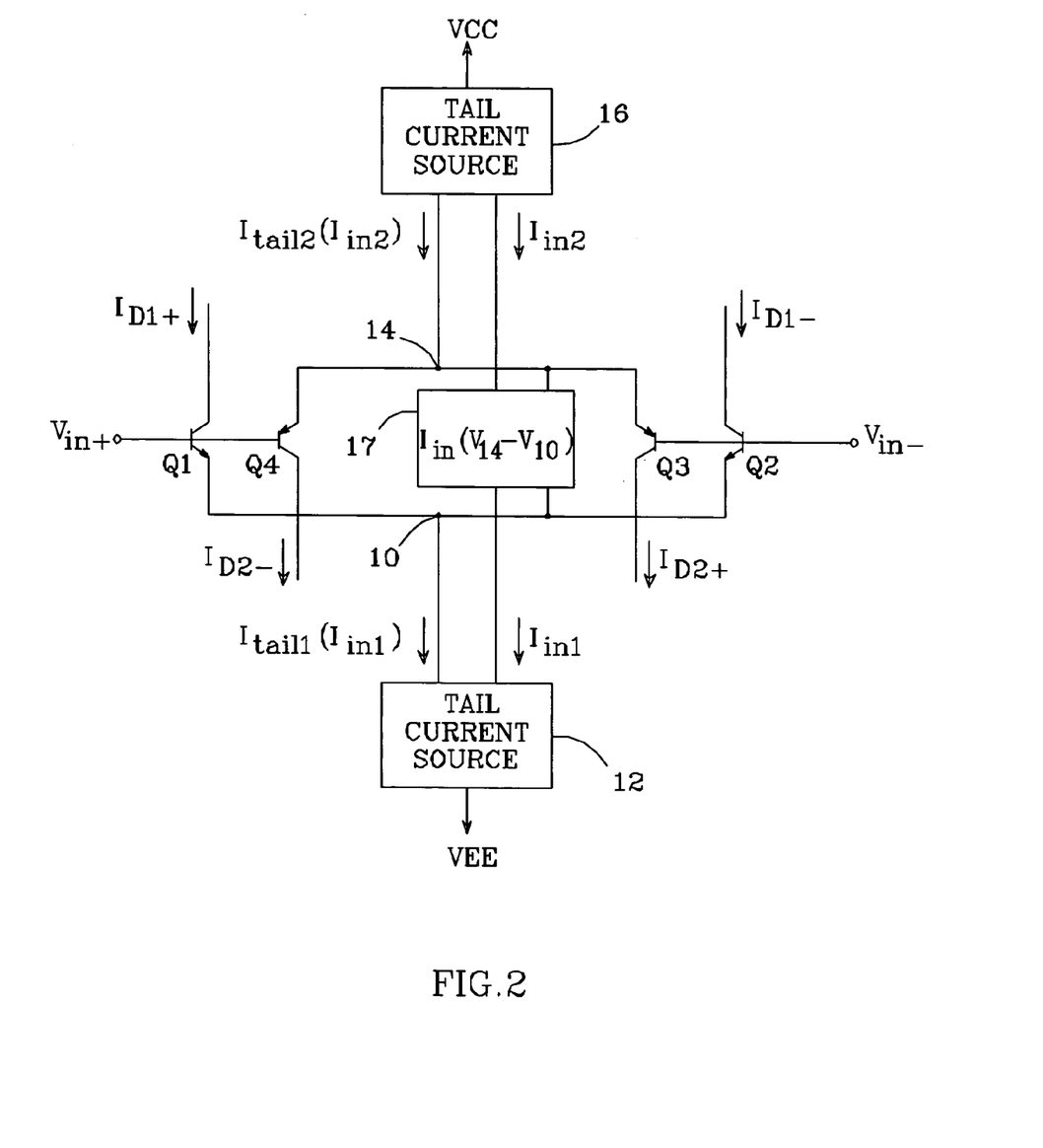
FIG. 2 is a schematic/block diagram of a common mode linearized input stage per the present invention.

The basic principles of a common mode linearized input stage per the present invention are shown in FIG. 2. A NPN differential transistor pair Q1/Q2 have their emitters connected together at a common node 10 and their bases connected to respective input terminals $V_{in+}$ and $V_{in-}$, which receive a differential input signal having a differential voltage $V_d$. A tail current source 12 provides a tail current $I_{tail1}$ to common node 10, and Q1 and Q2 conduct respective output currents $I_{D1+}$ and $I_{D1-}$ in response to an applied differential input signal.

Similarly, a PNP differential transistor pair Q3/Q4 have their emitters connected together at a common node 14 and their bases connected to input terminals $V_{in-}$ and $V_{in+}$, respectively. A tail current source 16 provides a tail current $I_{tail2}$ to common node 14, and Q3 and Q4 conduct respective output currents $I_{D2+}$ and $I_{D2-}$ in response to an applied differential input signal.

The input stage also includes a tail current modulation circuit 17 which generates complementary output currents $I_{in1}$, $I_{in2}$ as a function of the difference between the voltage at common node 14 ($V_{14}$) and the voltage at common node 10 ($V_{10}$). Tail current sources 12 and 16 are connected to receive complementary output currents $I_{in1}$ and $I_{in2}$, respectively, and are arranged to generate their respective tail currents $I_{tail1}$ and $I_{tail2}$ as a function of their complementary output currents; i.e., $I_{tail1}$ is a function of $I_{in1}$, and $I_{tail2}$ is a function of $I_{in2}$.

Tail current modulation circuit 17 is arranged to reduce the magnitudes of tail currents $I_{tail1}$ and $I_{tail2}$ when the differential input voltage $V_d$ is zero (i.e., when $|V_{14}-V_{10}|$ is at its maximum value), and to allow the tail currents to increase up to their maximum available values for an increasing differential input signal (as the magnitude of $|V_{14}-V_{10}|$ falls). When tail current modulation circuit 17 and tail current sources 12 and 16 are properly arranged, the input pairs' linear input range may be extended.

Figure 3:
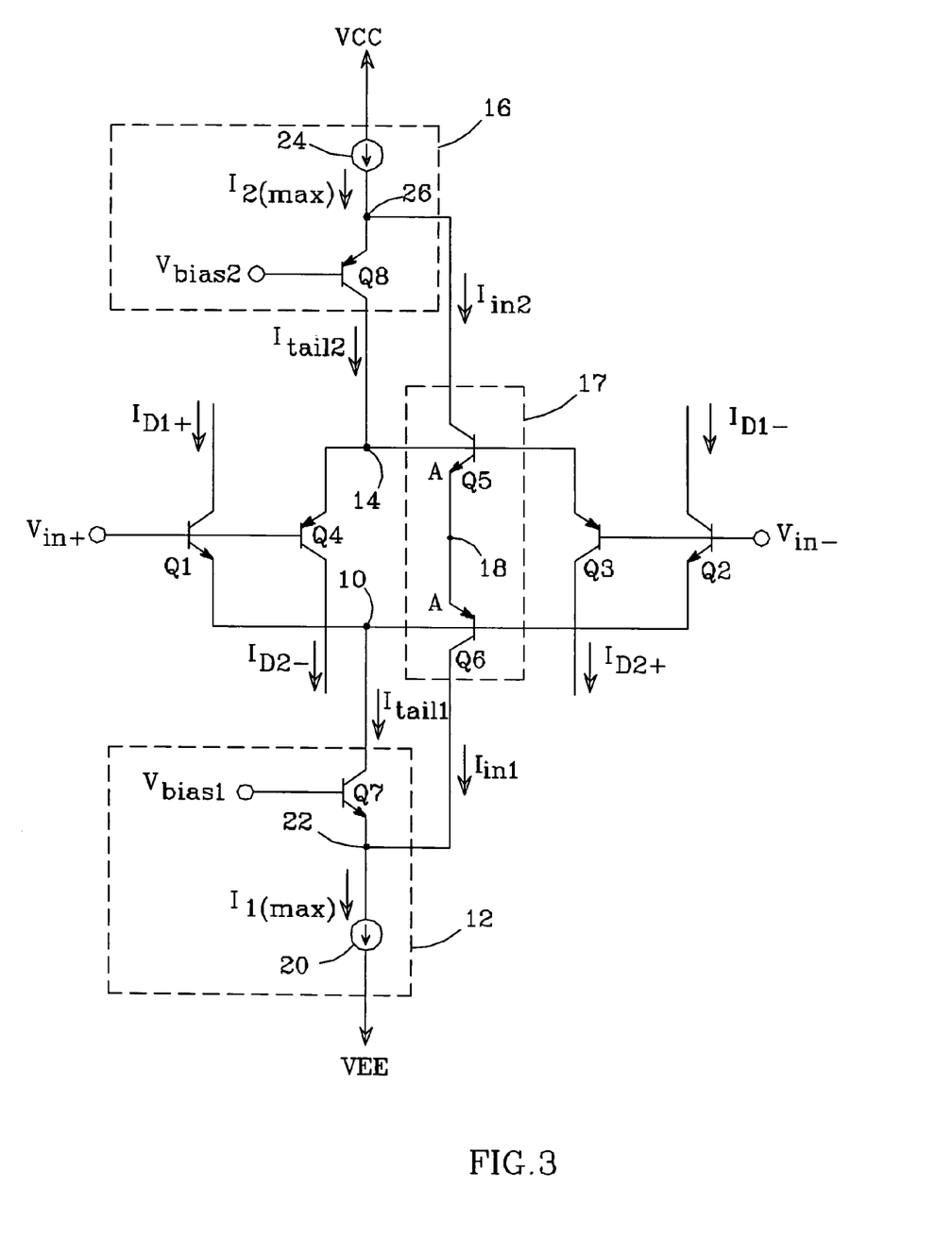
FIG. 3 is a schematic diagram of a preferred embodiment of the present common mode linearized input stage.

A preferred embodiment of a common mode linearized input stage is shown in FIG. 3. As in FIG. 2, NPN differential pair Q1/Q2 have their emitters connected together at common node 10, and PNP differential pair Q3/Q4 have their emitters connected together at common node 14, with the bases of both pairs connected to input terminals $V_{in-}$ and $V_{in+}$. Tail current sources 12 and 16 provides respective tail currents (identified here as simply "$I_{tail1}$" and "$I_{tail2}$") to common nodes 10 and 14, respectively. In response to an applied differential input signal, Q1 and Q2 conduct respective output currents $I_{D1+}$ and $I_{D1-}$, and Q3 and Q4 conduct respective output currents $I_{D2+}$ and $I_{D2-}$.

Tail current modulation circuit 17 is preferably implemented with a pair of "diversion" transistors Q5 and Q6. Q5 is an NPN transistor having its base connected to node 14, its collector connected to tail current source 16, and its emitter connected to a node 18. Q6 is a PNP transistor having its base connected to node 10, its collector connected to tail current source 12, and its emitter connected to node 18.

This configuration results in Q6 and Q5 conducting currents $I_{in1}$ and $I_{in2}$ such that they vary as a function of the difference between the voltages at node 14 and node 10 ($V_{14}-V_{10}$). When the input stage is in a balanced state—i.e., with a differential input voltage $V_d$ of zero—node 18 is at the differential input signal's common mode voltage $V_{cm}$, the voltage at common node 14 is one base-emitter voltage above $V_{cm}$, and the voltage at common node 10 is one base-emitter voltage below $V_{cm}$. As such, diversion transistors Q6 and Q5 both conduct and thereby divert tail currents $I_{tail1}$ and $I_{tail2}$ from the NPN and PNP differential input pairs. However, when a non-zero $V_d$ is applied to $V_{in+}$ and $V_{in-}$, NPN input pair Q1/Q2 pull up the voltage at node 10, and PNP input pair Q3/Q4 pull down the voltage at node 14, thereby reducing the base-emitter voltages of Q5 and Q6 and, if $V_d$ is large enough, causing them to turn off. This allows the tail currents $I_{tail1}$ and $I_{tail2}$ flowing through the input pairs to be as large as possible. In a large signal sense, this will result in a substantial increase in slew rate when compared with a simple differential pair having an equivalent input transconductance.

The diversion transistors are preferably differently-sized than the input pair transistors. Assume that Q1–Q4 have an emitter size of 1, Q5 and Q6 have an emitter size of A, and the maximum possible values for $I_{tail1}$ and $I_{tail2}$ (i.e., with Q5 and Q6 off) are equal to "$I_{1(max)}$" and "$I_{2(max)}$", respectively. Then, when Q5 and Q6 are on, they remove tail current from Q1–Q4 by a ratio proportional to A. When so arranged, the current $I_{D1+}$ conducted by NPN transistor Q1 is given by:

$$I_{D1+} = \frac{e^{\alpha}}{e^{\alpha} + A + e^{-\alpha}} * I_{1(max)},$$

the current conducted by NPN transistor Q2 is given by:

$$I_{D1-} = \frac{e^{-\alpha}}{e^{\alpha} + A + e^{-\alpha}} * I_{1(max)},$$

and the current $I_{div}$ conducted by diversion transistors Q5 and Q6 is given by:

$$I_{div} = \frac{A}{e^{\alpha} + A + e^{-\alpha}},$$

where α is given by:

$$\alpha = \frac{V_{in+} - V_{in-}}{2 * V_t},$$

where $V_t$ is the thermal voltage $kT/q$.

Similarly, the current $I_{D2+}$ conducted by PNP transistor Q3 is given by:

$$I_{D2+} = \frac{e^\alpha}{e^\alpha + A + e^{-\alpha}} * I_{2(max)},$$

and the current conducted by PNP transistor Q4 is given by:

$$I_{D2-} = \frac{e^{-\alpha}}{e^\alpha + A + e^{-\alpha}} * I_{2(max)}.$$

Taking the different between the two output currents, and then the derivative of the result, results in an expression for input stage transconductance $G_m$ as follows:

$$G_m = \frac{2A * \cosh\alpha + 4}{(2 * \cosh\alpha + A)^2} \cdot \frac{d\alpha}{d(V_{in+} - V_{in-})} \cdot I_{(max)}$$

(assuming $I_{1(max)} = I_{2(max)} = I_{(max)}$).

Figure 4:
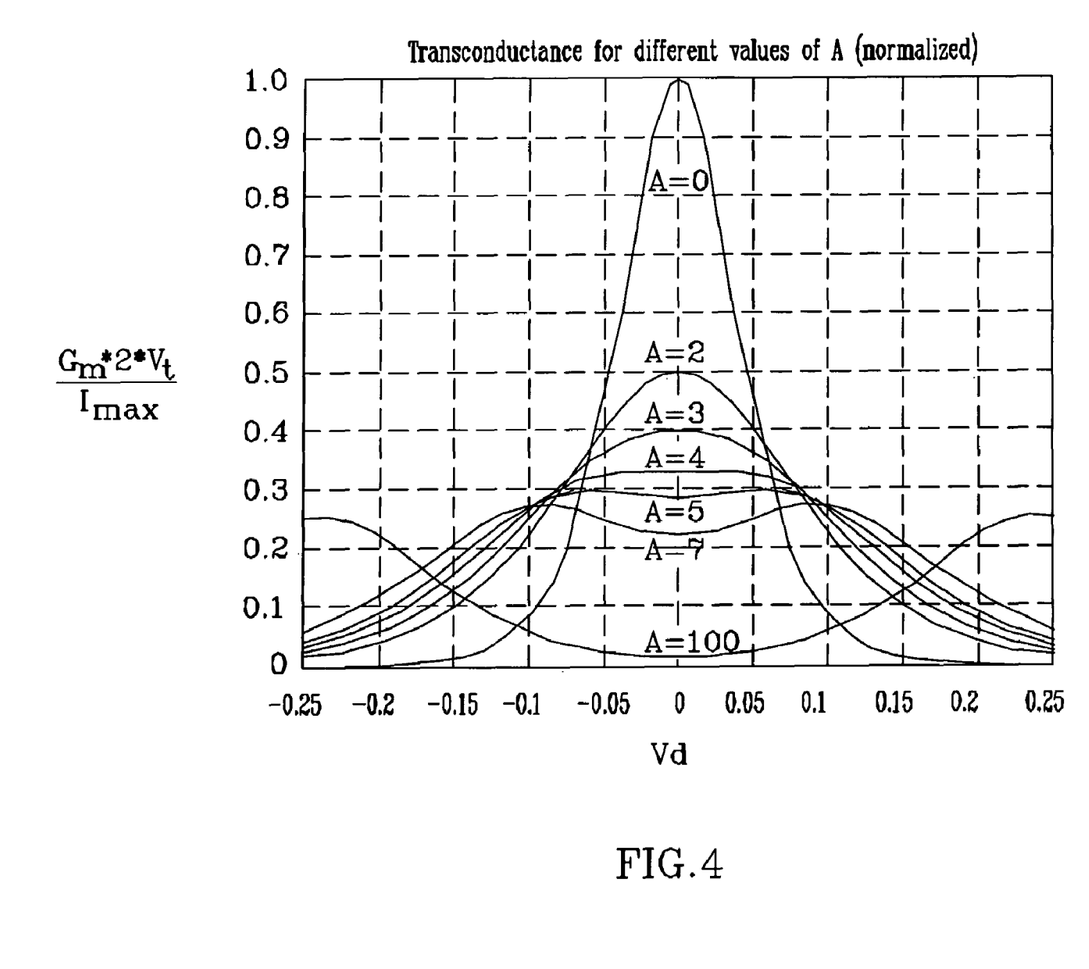
FIG. 4 is a graph of input stage transconductance vs. differential input voltage for a common mode linearized input stage per the present invention.

A graph of transconductance versus differential input voltage $V_d$ for various values of A is shown in FIG. 4. This graph demonstrates the present invention's ability to, by properly selecting a value for A, create not only a flat input transconductance and thereby linearize the input pairs, but also to create a transconductance that "decompresses" the input signal—i.e., gives the input stage an input gain that increases with $V_d$—to compensate for possible compression caused by later stages within the amplifier. As seen in FIG. 4, values for A of 4 or greater are preferred, as these values provide either a flat response or a response which decompresses the input signal.

Another benefit of using the present structure is that all current noise from diversion transistors Q5 and Q6 is common mode, as is noise from the tail current sources 12 and 16, just as in a single differential input pair. The remaining noise sources are those inherent in devices Q1/Q2 and Q3/Q4, such as base resistance and shot noise. In addition, the early voltage of devices Q5 and Q6 tracks with the differential input devices Q3/Q4 and Q1/Q2. Due to this tracking, there is in no common mode modulation of tail current based on early voltage effects of the diversion transistors. This results in increased PSRR and CMRR.

Note that the linear input range of the input stage shown in FIG. 3 could be extended even further with the use of degeneration resistors, respective ones of which would be connected in series with the emitters of Q1–Q6.

Tail current sources 12 and 16 can be implemented in a number of different ways. In FIG. 3, tail current source 12 comprises a fixed current source 20 which generates an output current $I_{1(max)}$ and a bias transistor Q7 which is biased with a voltage $V_{bias1}$. Q7's emitter is connected to fixed current source 20 at a node 22, and its collector is connected to node 10 such that Q7 conducts $I_{tail1}$. The collector of diversion transistor Q6 is connected to node 22 such that, when Q6 is off, $I_{tail1}$ is equal to $I_{1(max)}$. However, when Q6 is on, some of $I_{1(max)}$ is diverted by Q6, thereby reducing $I_{tail1}$ such that $I_{tail1} = I_{1(max)} + I_{in1}$.

Similarly, tail current source 16 comprises a fixed current source 24 which generates an output current $I_{2(max)}$, and a bias transistor Q8 which is biased with a voltage $V_{bias2}$. Q8's emitter is connected to fixed current source 24 at a node 26, and its collector is connected to node 14 such that Q8 conducts $I_{tail2}$. The collector of diversion transistor Q5 is connected to node 26 such that, when Q5 is off, $I_{tail2}$ is equal to $I_{2(max)}$. However, when Q5 is on, some of $I_{2(max)}$ is diverted by Q5, thereby reducing $I_{tail2}$ such that $I_{tail2} = I_{2(max)} - I_{in2}$. Bias voltages $V_{bias1}$ and $V_{bias2}$ are typically set no more that a few base-emitter voltages above the most negative rail (VEE) and a few base-emitter voltages below the most positive rail (VCC), respectively.

Note that the simplest implementation of current sources $I_{2(max)}$ and $I_{1(max)}$ uses a single resistor for each and the appropriate selection of $V_{bias2}$ and $V_{bias1}$.

Figure 5:
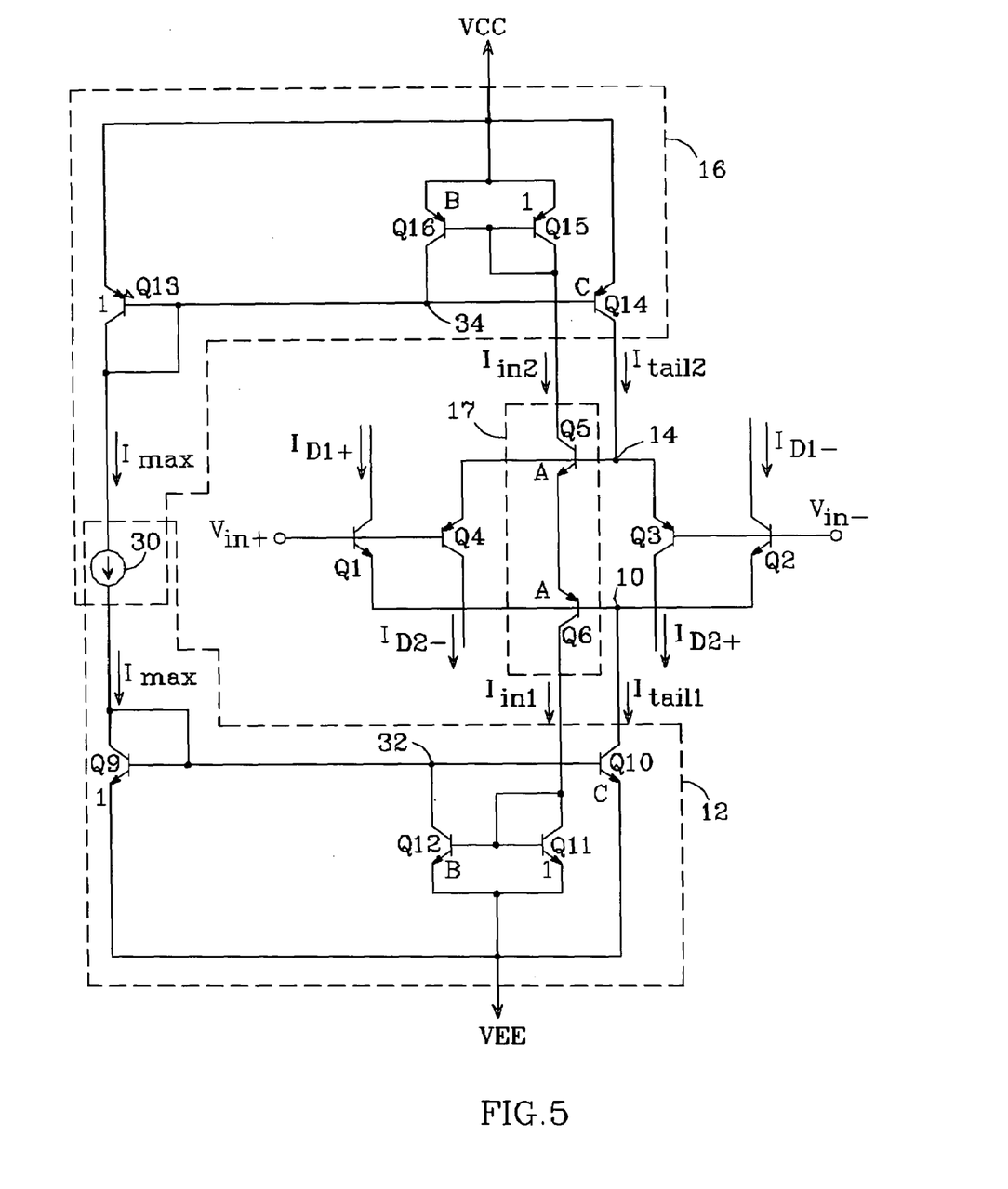
FIG. 5 is a schematic diagram of an alternative embodiment of a common mode linearized input stage per the present invention.

An alternative implementation for tail current sources 12 and 16 is shown in FIG. 5. For tail current source 12, a fixed current source 30 provides an output current $I_{max}$ to a first current mirror comprising a diode-connected input transistor Q9 and an output transistor Q10; the bases of Q9 and Q10 are connected together at a node 32. Transistors Q9 and Q10 are connected to mirror $I_{max}$ to node 10, such that Q10 conducts $I_{tail1}$. A second current mirror comprises a diode-connected input transistor Q11 and an output transistor Q12. Transistor Q11 is connected to mirror the current conducted by diversion transistor Q6 (i.e., $I_{in1}$) to Q12, which is connected to node 32. When so arranged, when Q6 is off, $I_{tail1}$ is equal to $I_{max}$ (assuming Q9:Q10=1:1). However, when Q6 is on, some of $I_{max}$ is diverted from mirror transistor Q9, thereby reducing the $I_{max}$ current mirrored to node 10—and thus reducing $I_{tail1}$.

Similarly, for tail current source 16, output current $I_{max}$ is provided to a third current mirror comprising a diode-connected input transistor Q13 and an output transistor Q14; the bases of Q13 and Q14 are connected together at a node 34. Transistors Q13 and Q14 are connected to mirror $I_{max}$ to node 14, such that Q14 conducts $I_{tail2}$. A fourth current mirror comprises a diode-connected input transistor Q15 and an output transistor Q16. Transistor Q15 is connected to mirror the current conducted by diversion transistor Q5 (i.e., $I_{in2}$) to Q16, which is connected to node 34. When so arranged, when Q5 is off, $I_{tail2}$ is equal to $I_{max}$ (assuming Q13:Q14=1:1). However, when Q5 is on, some of $I_{max}$ is diverted from mirror transistor Q13, thereby reducing the $I_{max}$ current that is mirrored to node 14—and thus reducing $I_{tail2}$.

The tail current sources shown in FIG. 5 might be preferred in that they provide more flexibility than those shown in FIG. 3. Here, the Q11/Q12 and Q15/Q16 current mirrors can be sized as needed (size "B"), and the Q9/Q10 and Q13/Q14 current mirrors can be sized as needed (size "C"), to provide desired slew rate, current consumption, and/or common mode noise characteristics. Making the product of A, B and C=4 provides the flattest response. In addition, this arrangement enables Q5 and Q6 to be scaled down and $I_{max}$ to be made dynamic so that it need only be large when a large differential input voltage is applied to $V_{in+}$ and $V_{in-}$. This type of input stage should be limited to use in low noise applications. In low noise applications, the input devices are typically large; this would result in Q5 and Q6 being very large (A times larger) using the FIG. 3 implementation; such a configuration typically has a correspondingly large current consumption. Here, Q5 and Q6 need only be A/B*C the size of the input devices, saving both area and current.

Figure 6:
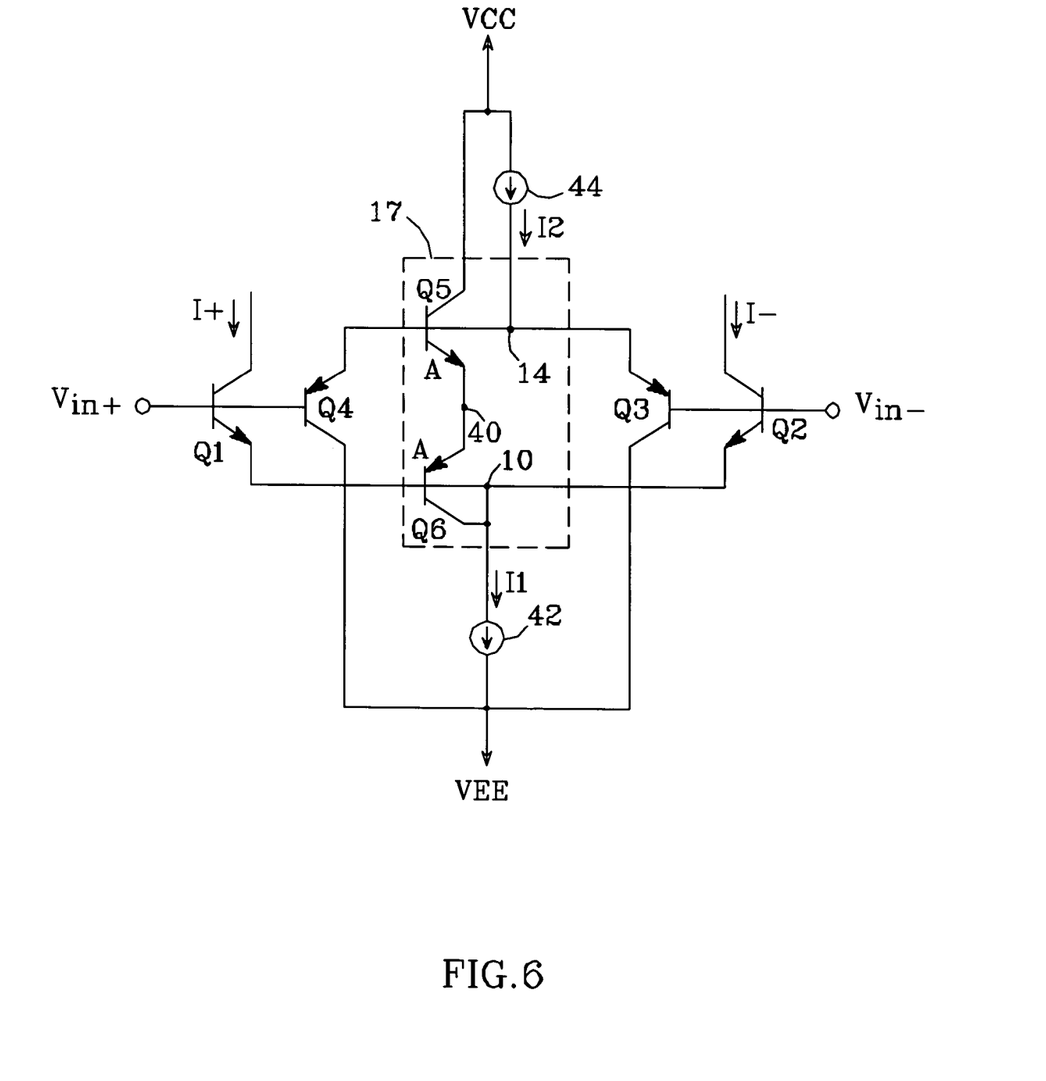
FIG. 6 is a schematic diagram of an embodiment of a single-ended version of a common mode linearized input stage per the present invention.

A single-ended version of the present invention is shown in FIG. 6. As before, the NPN and PNP differential transistor pairs Q1/Q2 and Q3/Q4 are connected to input terminals $V_{in+}$ and $V_{in-}$. The emitters of Q1/Q2 are connected to common node 10, and the emitters of Q3/Q4 are connected to common node 14. Here, however, the collectors of Q3/Q4 do not provide a differential output current, but are instead connected to supply voltage VEE. The connections of diversion transistors Q5 and Q6 are largely the same, with the bases of Q6 and Q5 connected to nodes 10 and 14, respectively, and their emitters connected together at a common node 40.

A tail current source 42 providing an output current I1 is connected to node 10, and a current source 44 providing an output current I2 is connected to node 14. The collector of diversion transistor Q6 is connected to current source 42. Here, however, the collector of diversion transistor Q5 is connected to supply voltage VCC.

In operation, output current I2 in combination with the common mode voltage $V_{cm}$ establishes a voltage at node 14. The resulting current in Q5 and Q6 subtracts tail current from input pair Q1/Q2. It should be noted that, when the FIG. 6 circuit is arranged for a response with maximal flatness, the stage's linear input range is half that of the fully complementary embodiment shown in FIG. 2 —unless a proportional current (not shown) is subtracted from I2.

Figure 7:
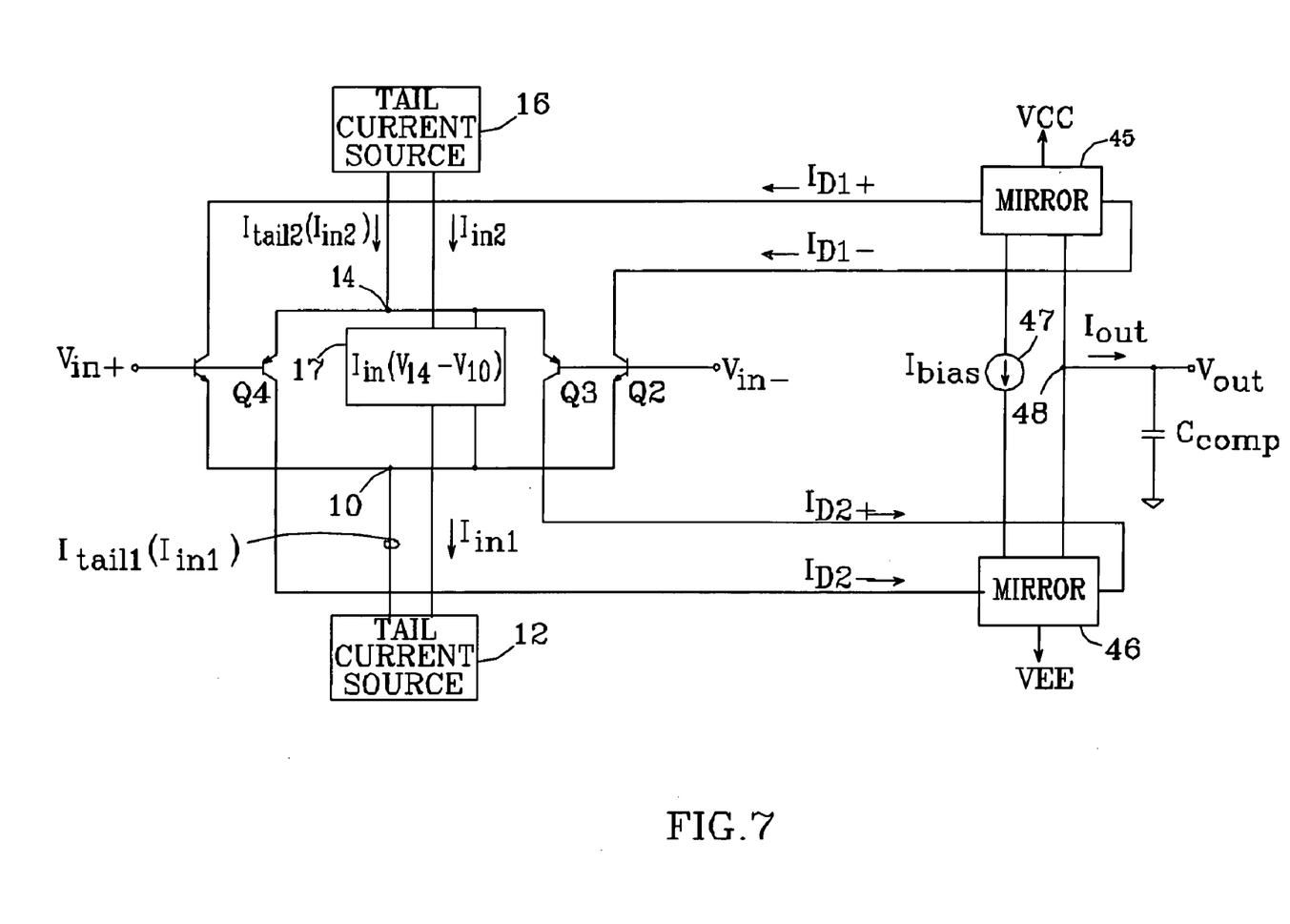
FIG. 7 is a block diagram of an amplifier topology which includes the present input stage coupled to an input stage mirroring structure.

The present common mode linearized input stage is preferably coupled to an input stage mirroring structure as shown in FIG. 7. NPN input pair Q1/Q2 produces differential output currents $I_{D1+}/I_{D1-}$, which are coupled to balanced nodes on each side of a current mirror circuit 45. The PNP input pair produces differential output currents $I_{D2+}/I_{D2-}$, which are coupled to balanced nodes on each side of a current mirror circuit 46 which is complementary to current mirror circuit 45. The complementary current mirror circuits are fed by a single floating current source 47 and produce a single-ended output current $I_{out}$ at an output node 48. A compensation capacitor $C_{comp}$ is preferably connected between output node 48 and ground. Noise due to current source 47 is correlated for the two mirror circuits, such that its noise sums to zero at the output.

The present input stage is connected to the mirroring structure in a balanced fashion: i.e., with $I_{D1+}$ and $I_{D1-}$ connected across current mirror circuit 45, and $I_{D2+}$ and $I_{D2-}$ connected across current mirror circuit 46. If there is a variation in $I_{tail1}$, $I_{D1+}$ and $I_{D1-}$ are affected equally such that the balanced nodes on each side of mirror circuit 45 go up or down by equal amounts, with no resulting change in output current $I_{out}$. Similarly, if $I_{tail2}$ varies, $I_{D2+}$ and $I_{D2-}$ are affected equally such that the balanced nodes on each side of mirror circuit 46 go up or down by equal amounts, without affecting output current $I_{out}$. In this way, common mode noise is rejected. Since differential output currents $I_{D1+}/I_{D1-}$ and $I_{D2+}/I_{D2-}$ inject offset currents into mirror circuits 45 and 46, respectively, which are otherwise balanced, output current $I_{out}$ only varies when $I_{D1+}$ and $I_{D1-}$, or $I_{D2+}$ and $I_{D2-}$, are unequal.

Figure 8:
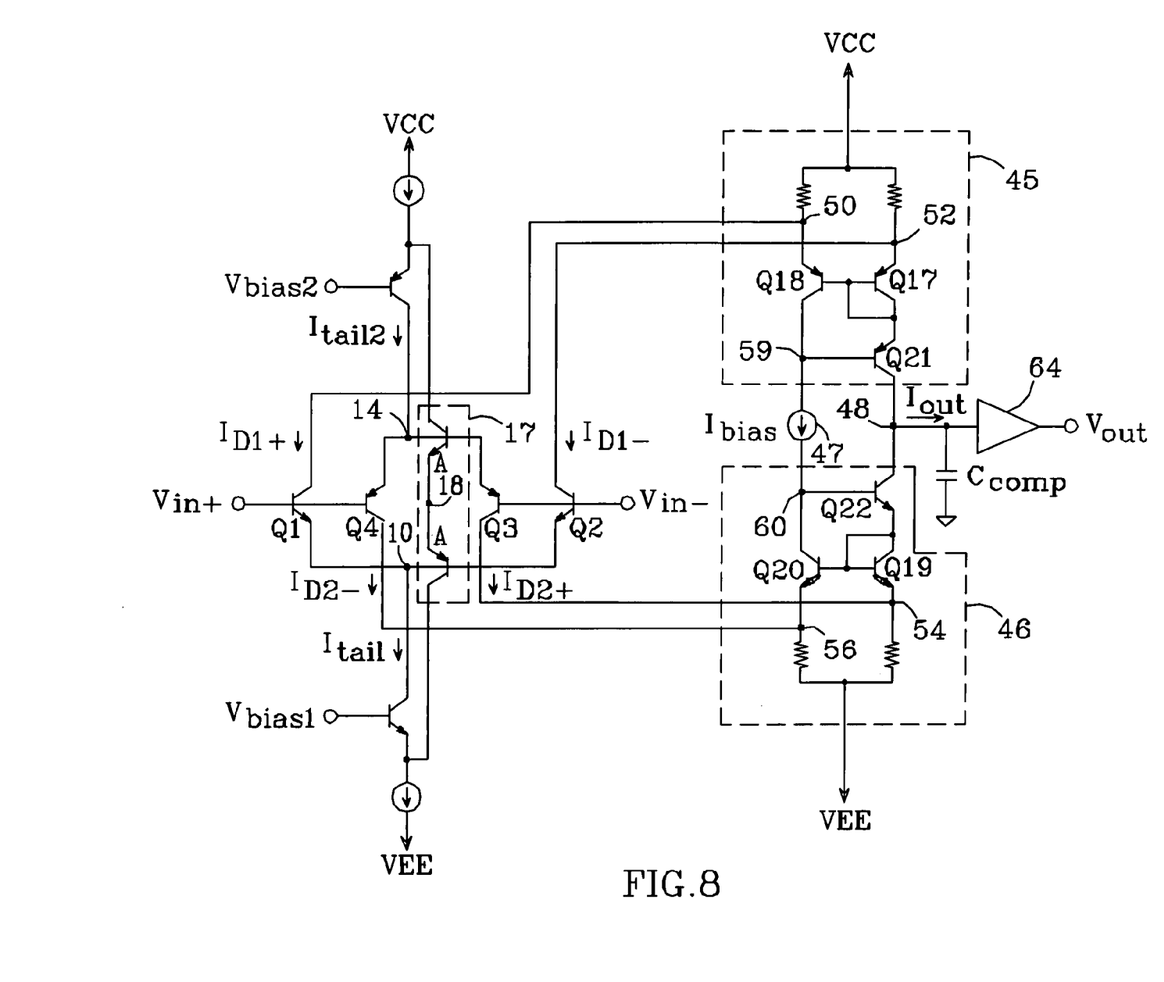
FIG. 8 is a schematic diagram of a preferred embodiment of a common mode linearized input stage and input stage mirroring structure per the present invention.

A preferred embodiment of an input stage mirroring structure is shown in FIG. 8. Differential currents $I_{D1+}$ and $I_{D1-}$ are connected to current mirror circuit 45 at nodes 50 and 52, respectively, which are also connected to supply voltage VCC via a pair of degeneration resistors; mirror circuit 45 also includes a current mirror made from PNP input and output transistors Q17 and Q18, respectively, connected between nodes 50 and 52. Similarly, differential currents $I_{D2+}$ and $I_{D2-}$ are connected to current mirror circuit 46 at nodes 54 and 56, respectively, which are also connected to supply voltage VEE via a pair of degeneration resistors; mirror circuit 45 also includes a current mirror made from NPN input and output transistors Q19 and Q20, respectively, connected between nodes 54 and 56. Floating current source 47 produces a bias current $I_{bias}$, which is connected to mirror output transistor Q18 at a node 59, and to mirror output transistor Q20 at a node 60. Current mirror circuit 45 also includes a PNP output transistor Q21, which has its base connected to node 59, its emitter connected to Q17 and its collector connected to output node 48. Current mirror circuit 46 also includes a NPN output transistor Q22, which has its base connected to node 60, its emitter connected to Q19 and its collector connected to output node 48. A compensation capacitor $C_{comp}$ is preferably connected between output node 48 and ground. A buffer or output stage 64 may be connected to output node 48 to produce an overall output voltage $V_{OUT}$.

In operation, the mirroring structure provides an output voltage $V_{out}$ and an output current $I_{out}$ at node 48, both of which vary with $I_{D1+}$, $I_{D1-}$, $I_{D2+}$ and $I_{D2-}$. An increase in $I_{D2-}$ (for example) causes the voltage at node 56 to increase. Neglecting all base currents, mirror output transistor Q22 forms a loop with input transistor Q19 and output transistor Q20, forcing Q20's output current to equal $I_{bias}$ for all differential input values of $I_{D2+}-I_{D2-}$. This causes the $V_{be}$ of Q20 to be constant, and the voltage at the base/collector of Q19 to track with the increasing voltage at node 56. As the base/collector of Q19 increases, the emitter of Q19 must also increase, causing more current to flow in Q19 and Q22. This current flow is aided by the corresponding drop of $I_{D2+}$, which decreases with increasing $I_{D2-}$. Similarly, the voltage at node 56 decreases with decreasing $I_{D2-}$, causing the base/collector of Q19 to decrease. Q20's $V_{be}$ is constant, so the emitter of Q19 decreases, along with the current flowing through Q19 and Q22. $I_{D2+}$ increases with decreasing $I_{D2-}$, causing the current in Q19 and Q22 to decrease further. Mirror circuit 45 operates in a complementary fashion to mirror 46.

The structure shown provides a high gain-producing output impedance, good input stage headroom, good recovery after slew, and low inherent noise. Due to the balanced connection of the input stage into the Q17/Q18 and Q19/Q20 mirrors, the integrity of the differential input path is maintained, which enables the common mode noise of the input stage to be rejected. The peak output current for slewing is not limited by the size of $I_{bias}$, which permits a fairly low $I_{bias}$ current to produce high output slew currents. Here, the peak output current is only limited by the peak value of the tail currents $I_{tail1}$ and $I_{tail2}$.

Several factors should be considered when selecting the value of $I_{bias}$. If $I_{bias}$ is too low, the input signal would be extremely compressed by the mirroring structure, and the structure's transistors would operate at less than their peak speed. But if $I_{bias}$ is too high, current consumption may be unacceptably high.

One drawback to the mirroring structure shown in FIG. 8 is that it tends to compress a linear input current. When the input stage is balanced ($I_{D1+}=I_{D1-}$, $I_{D2+}=I_{D2-}$), the current densities in the current mirror transistors Q17/Q18 and Q19/Q20 are equal, the current out of each complementary mirror is equal to $I_{bias}$, and $I_{out}=0$. However, when non-zero differential currents are applied to the mirroring structure, the current densities in the mirror transistors become unequal, which causes the differential input current to be compressed; i.e., $I_{out}$ changes less and less for an increasing differential input current.

One method to limit the compression would be to increase $I_{bias}$ until the desired level of linearity is reached. This has the drawback of using substantially more current than actually necessary, and possibly increasing the voltage drop across the degeneration resistors to an unacceptable level. Alternatively, $I_{bias}$ could be increased dynamically based on the size of the differential input voltage, but this has the negative effect of creating a slope to the linear region of the input transconductance in the presence of reasonable device mismatch, which would appear as second harmonic distortion on the output since the transconductance is not balanced on both sides of zero.

Thus, the preferred method of compensating for the mirroring structure's compression is to select a value for the input stage's scaling ratio A that causes the input stage to decompress the differential currents a corresponding amount, thereby producing a linear output current at the output node 48 of the amplifier.

Figure 9:
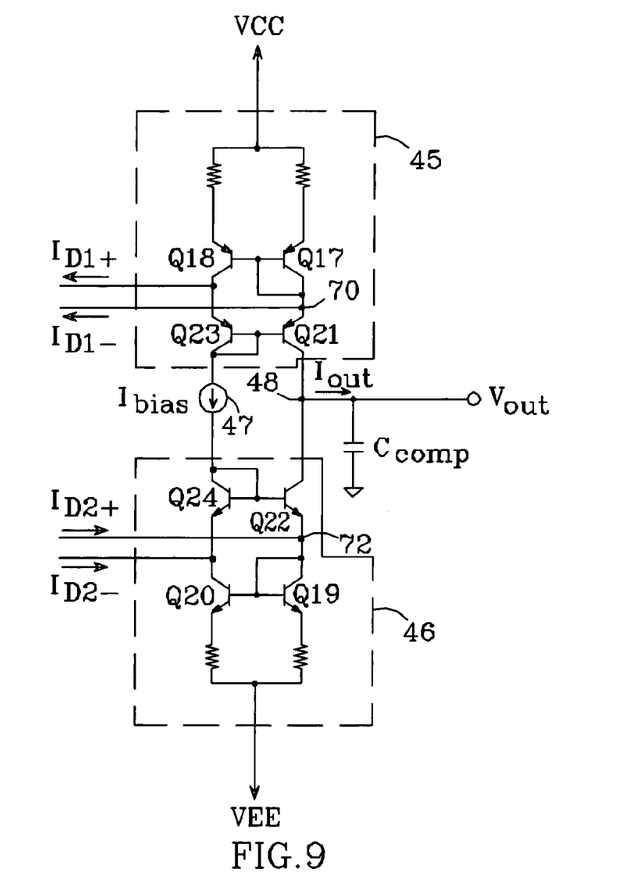
FIG. 9 is a schematic diagram of a alternative embodiment for an input stage mirroring structure per the present invention.

One possible alternative implementation for the input-stage mirroring structure is shown in FIG. 9. Here, the differential currents $I_{D1+}/I_{D1-}$, $I_{D2+}/I_{D2-}$ are connected on the opposite sides of the Q17/Q18 and Q19/Q20 current mirrors: $I_{D1+}$ is connected to the collector of Q18 and $I_{D1-}$ is connected to a node 70 at the junction of Q17 and Q21, while $I_{D2+}$ is connected to a node 72 at the junction of Q19 and Q22 and $I_{D2-}$ is connected to the collector of Q20. Two additional transistors Q23 and Q24 are preferably paired with Q21 and Q22, respectively, to balance the voltages in mirror circuits 45 and 46. When so arranged, the current in output transistor Q22 is given by:

$$I_{Q22}=I_{bias}-(I_{D2+}-I_{D2-}),$$

the current in output transistor Q21 is given by:

$$I_{Q21}=I_{bias}-(I_{D1-}-I_{D1+}),$$

and the output current is given by:

$$I_{out}=I_{Q21}-I_{Q22}=I_{D2+}+I_{D1+}-I_{D2-}-I_{D1-})$$

Here, the mirror transistor currents are equal (i.e., $I_{Q19}=I_{Q20}$, $I_{Q17}=I_{Q18}$) as long as the applied differential currents (i.e., $I_{D1+}-I_{D1-}$, $I_{D2+}-I_{D2-}$) are less than $I_{bias}$. With equal currents in the mirror devices, there is no compression of the differential input currents. However, this arrangement may suffer from overload problems when the amplifier is slewing.

Note that the input stage mirroring structures shown in FIGS. 8 and 9 are merely exemplary. A mirroring structure as shown in FIG. 7, having complementary mirrors fed by a single floating current source, could be implemented in a number of different ways—many of which would be suitable for use with the present input stage.

Note also that the present common mode linearized input stage is not limited to use with the mirroring structures depicted. Though the mirroring structures shown work well with the present input stage, advantages are provided by the common mode linearized input stage regardless of the nature of the following stage.

Figure 10:
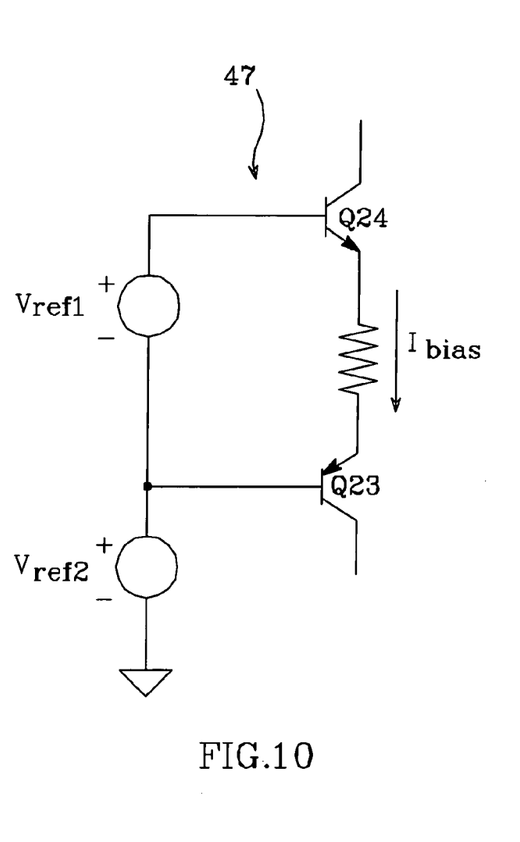
FIG. 10 is a schematic diagram of a preferred embodiment of a bias current source per the present invention.

A preferred implementation of current source 47 is shown in FIG. 10. A PNP transistor Q23 and an NPN transistor Q24 are connected in series via a resistor R1. A reference voltage $V_{ref1}$ is connected between the bases of Q23 and Q24, and a reference voltage $V_{ref2}$ is connected between ground and the base of Q23, such that Q23 and Q24 conduct bias current $I_{bias}$. When arranged as shown, the current noise that comes out of both ends of the structure is correlated, so that the noise on the output sides of the Q17/Q18 and Q19/Q20 current mirrors sums to zero.

While particular embodiments of the invention have been shown and described, numerous variations and alternate embodiments will occur to those skilled in the art. Accordingly, it is intended that the invention be limited only in terms of the appended claims.

I claim:

1. A common mode linearized input stage, comprising:
   a differential input terminal $V_{in+}$;
   a differential input terminal $V_{in-}$, said differential input terminals connected to receive a differential input signal;
   first and second NPN transistors arranged as a differential transistor pair, the bases of said first and second NPN transistors connected to $V_{in+}$ and $V_{in-}$, respectively, the emitters of said first and second NPN transistors connected together at a first node, and the collectors of said first and second NPN transistors conducting respective currents $I_{D1+}$ and $I_{D1-}$ in response to said differential input signal;
   first and second PNP transistors arranged as a differential transistor pair, the bases of said first and second PNP transistors connected to $V_{in-}$ and $V_{in+}$, respectively, the emitters of said first and second PNP transistors connected together at a second node, and the collectors of said first and second PNP transistors conducting respective currents $I_{D2+}$ and $I_{D2-}$ in response to said differential input signal;
   a first tail current source connected to said first node to provide a first tail current $I_{tail1}$ to said NPN differential transistor pair;
   a second tail current source connected to said second node to provide a second tail current $I_{tail2}$ to said PNP differential transistor pair; and
   a tail current modulation circuit which generates complementary output currents $I_{in1}$, $I_{in2}$ as a function of the difference between the voltages at said first and second nodes;
   said first tail current source arranged to generate said first tail current $I_{tail1}$ as a function of $I_{in1}$, and said second tail current source arranged to generate said second tail current $I_{tail2}$ as a function of $I_{in2}$, said tail current modulation circuit and said first and second tail current sources arranged such that the magnitudes of tail currents $I_{tail1}$ and $I_{tail2}$ increase with an increasing differential input signal.

2. The input stage of claim 1, wherein said tail current modulation circuit comprises:
   a PNP diversion transistor having its base connected to said first node, its collector coupled to said first tail current source, and its emitter connected to a third node; and
   a NPN diversion transistor having its base connected to said second node, its collector coupled to said second tail current source, and its emitter connected to said third node,
   said PNP and NPN diversion transistors conducting complementary output currents $I_{in1}$ and $I_{in2}$, respectively.

3. The input stage of claim 2, wherein the transistors comprising said NPN and PNP differential transistors pairs each have an emitter size of 1, and said NPN and PNP diversion transistors each have an emitter size of A, such that, when fully conducting, said PNP and NPN diversion transistors reduce said first and second tail currents by a scaling ratio of A.

4. A common mode linearized input stage, comprising:
- a differential input terminal $V_{in+}$;
- a differential input terminal $V_{in-}$, said differential input terminals connected to receive a differential input signal;
- first and second NPN transistors arranged as a differential transistor pair, the bases of said first and second NPN transistors connected to $V_{in+}$ and $V_{in-}$, respectively, the emitters of said first and second NPN transistors connected together at a first node, and the collectors of said first and second NPN transistors conducting respective currents $I_{D1+}$ and $I_{D1-}$ in response to said differential input signal;
- first and second PNP transistors arranged as a differential transistor pair, the bases of said first and second PNP transistors connected to $V_{in-}$ and $V_{in+}$, respectively, the emitters of said first and second PNP transistors connected together at a second node, and the collectors of said first and second PNP transistors conducting respective currents $I_{D2+}$ and $I_{D2-}$ in response to said differential input signal;
- a first tail current source connected to said first node to provide a first tail current $I_{tail1}$ to said NPN differential transistor pair;
- a second tail current source connected to said second node to provide a second tail current $I_{tail2}$ to said PNP differential transistor pair;
- a PNP diversion transistor having its base connected to said first node, its collector coupled to said first tail current source, and its emitter connected to a third node; and
- a NPN diversion transistor having its base connected to said second node, its collector coupled to said second tail current source, and its emitter connected to said third node, such that said PNP and NPN diversion transistors conduct complementary output currents $I_{in1}$ and $I_{in2}$, respectively, as a function of the difference between the voltages at said first and second nodes;
- said first tail current source arranged to generate $I_{tail1}$ as a function of $I_{in1}$ and said second tail current source arranged to generate $I_{tail2}$ as a function of $I_{in2}$, such that the magnitudes of $I_{tail1}$ and $I_{tail2}$ increase with an increasing differential input signal.

5. The input stage of claim 4, wherein the transistors comprising said NPN and PNP differential transistors pairs each have an emitter size of 1, and said NPN and PNP diversion transistors each have an emitter size of A, such that, when fully conducting, said PNP and NPN diversion transistors reduce said first and second tail currents by a scaling ratio of A.

6. The input stage of claim 5, wherein the values of $I_{tail1}$ and $I_{tail2}$ when said PNP and NPN diversion transistors are off are equal to $I_{1(max)}$ and $I_{2(max)}$, respectively, and said input stage is arranged such that the current $I_{D1+}$ conducted by said first NPN transistor is given by:

$$I_{D1+} = \frac{e^{\alpha}}{e^{\alpha} + A + e^{-\alpha}} * I_{1(max)}$$

the current conducted by said second NPN transistor is given by:

$$I_{D1-} = \frac{e^{-\alpha}}{e^{\alpha} + A + e^{-\alpha}} * I_{1(max)}$$

and the current $I_{div}$ conducted by said PNP and NPN diversion transistors is given by:

$$I_{div} = \frac{A}{e^{\alpha} + A + e^{-\alpha}}$$

where $\alpha$ is given by:

$$\alpha = \frac{V_{in+} - V_{in-}}{2 * V_t},$$

where $V_t$ is the thermal voltage $$\frac{kT}{q},$$

and the transconductance $G_m$ of the input stage is given by:

$$G_m = \frac{2A * \cosh\alpha + 4}{(2 * \cosh\alpha + A)^2} \cdot \frac{d\alpha}{d(V_{in+} - V_{in-})} \cdot I_{(max)}$$

(assuming $I_{1(max)} = I_{2(max)} = I_{(max)}$).

7. The input stage of claim 5, wherein the value of A is selected such that $G_m$ increases with the magnitude of said differential input signal.

8. The input stage of claim 5, wherein the value of A is selected to linearize the response of said NPN and PNP differential transistor pairs.

9. The input stage of claim 5, wherein the value of A is selected to provide a transconductance $G_m$ for said input stage that decompresses said differential input signal.

10. The input stage of claim 9, further comprising a following stage which receives said currents $I_{D1+}$, $I_{D1-}$, $I_{D2+}$ and $I_{D2-}$ and produces an output current in response, said following stage having an associated compression characteristic such that said output current does not vary linearly with said currents $I_{D1+}$, $I_{D1-}$, $I_{D2+}$ and $I_{D2-}$, wherein the value of A is selected to provide a transconductance $G_m$ for said input stage that decompresses said differential input signal so as to compensate for said following stage's compression.

11. The input stage of claim 5, wherein the value of A is at least four.

12. The input stage of claim 4, wherein said first tail current source comprises:
- a first fixed current source connected to provide a first output current at a fourth node; and
- a first bias transistor having its current circuit connected between said first node and said fourth node and biased to conduct at least a portion of said first output current as said first tail current $I_{tail1}$, the collector of said PNP diversion transistor coupled to said fourth node such that $I_{tail1}$ is reduced when said PNP diversion transistor is conducting;

and said second tail current source comprises:
a second fixed current source connected to provide a second output current at a fifth node; and
a second bias transistor having its current circuit connected between said second node and said fifth node and biased to conduct at least a portion of said second output current as said second tail current $I_{tail2}$, the collector of said NPN diversion transistor coupled to said fifth node such that $I_{tail2}$ is reduced when said NPN diversion transistor is conducting.

13. The input stage of claim 12, wherein said first and second fixed current sources are first and second resistors, respectively.

14. The input stage of claim 4, wherein said first tail current source comprises:
a first fixed current source connected to provide a first output current; and
a first current mirror connected to mirror said first output current to said first node such that at least a portion of said first output current is provided as said first tail current $I_{tail1}$, said first current mirror comprising:
a first diode-connected input transistor connected to receive said first output current, and
a first output transistor having its base connected to the base of said first diode-connected transistor at a fourth node and its emitter connected to said first diode-connected transistor's emitter such that said first output current is mirrored to said first node and said first output transistor conducts said first tail current $I_{tail1}$; and
a second current mirror, comprising:
a second diode-connected input transistor coupled to the collector of said PNP diversion transistor, and
a second output transistor connected to mirror the current in said PNP diversion transistor to said fourth node such that $I_{tail1}$ is reduced when said PNP diversion transistor is conducting; and
said second tail current source comprises:
a third current mirror connected to mirror said first output current to said second node such that at least a portion of said first output current is provided as said second tail current $I_{tail2}$, said third current mirror comprising:
a third diode-connected input transistor connected to receive said first output current, and
a third output transistor having its base connected to the base of said third diode-connected transistor at a fifth node and its emitter connected to said third diode-connected transistor's emitter such that said first output current is mirrored to said second node and said third output transistor conducts said second tail current $I_{tail2}$; and
a fourth current mirror, comprising:
a fourth diode-connected input transistor coupled to the collector of said NPN diversion transistor, and
a fourth output transistor connected to mirror the current in said NPN diversion transistor to said fifth node such that $I_{tail2}$ is reduced when said NPN diversion transistor is conducting.

15. The input stage of claim 4, wherein said input stage is arranged such that said PNP and NPN diversion transistors are off when said input stage is slewing in response to a changing differential input signal.

16. The input stage of claim 4, further comprising a input stage mirroring structure connected between first and second supply voltages and which receives said currents $I_{D1+}$, $I_{D1-}$, $I_{D2+}$ and $I_{D2-}$ and produces an output current in response, said input stage mirroring structure comprising:
a first current mirror circuit having an input and output, said differential output currents $I_{D1+}$ and $I_{D1-}$ coupled to first current mirror circuit at fourth and fifth nodes, respectively, said first current mirror circuit arranged such that $I_{D1+}$ and $I_{D1-}$ inject offset current into an otherwise balanced current mirror such that the current at said first current mirror circuit's output varies only when $I_{D1+}$ and $I_{D1-}$ are unequal;
a second current mirror circuit having an input and output and complementary to said first current mirror circuit, said differential output currents $I_{D2+}$ and $I_{D2-}$ coupled across said second current mirror circuit at sixth and seventh nodes, respectively, said second current mirror circuit arranged such that $I_{D2+}$ and $I_{D2-}$ inject offset current into an otherwise balanced current mirror such that the current at said second current mirror circuit's output varies only when $I_{D2+}$ and $I_{D2-}$ are unequal;
a single floating current source connected between the inputs of said first and second current mirror circuits, the outputs of said first and second current mirror circuits coupled to an output node, the current at said output node being said output current;
such that noise due to said floating current source is correlated for the two current mirror circuits such that said noise sums to zero at said output node, said input stage connected to said mirroring structure in a balanced fashion such that a change in $I_{tail1}$ shifts the voltages at said fourth and fifth nodes by equal amounts and a change in $I_{tail2}$ shifts the voltages at said sixth and seventh nodes by equal amounts without changing said output current, thereby rejecting common mode noise.

17. The input stage of claim 16, wherein said floating current source comprises:
an NPN transistor;
a PNP transistor;
a resistor, the emitter of said NPN transistor connected in series with the emitter of said PNP transistor via said resistor;
a first reference voltage connected between the bases of said NPN and PNP transistors; and
a second reference voltage connected between ground and the base of said PNP transistor;
such that said NPN and PNP transistors conduct said bias current $I_{bias}$.

18. The input stage of claim 16, further comprising a compensation capacitor connected between said output node and one of said supply voltages.

19. The input stage of claim 16, further comprising a buffer stage connected at its input to said output node and providing a buffered version of said output current at its output.

20. The input stage of claim 16, wherein the transistors comprising said NPN and PNP differential transistor pairs each have an emitter size of 1, and said NPN and PNP diversion transistors each have an emitter size of A, such that said PNP and NPN diversion transistors conduct and thereby divert said first and second tail currents by a scaling ratio of A when said differential input signal is zero, wherein the value of A is selected to provide a transconductance $G_m$ for said input stage that decompresses said differential input signal.

21. The input stage of claim 20, wherein said input stage mirroring structure has an associated compression characteristic such that said output current does not vary linearly with said currents $I_{D1+}$, $I_{D1-}$, $I_{D2+}$ and $I_{D2-}$, wherein the value of A is selected to provide a transconductance $G_m$ for said input stage that decompresses said differential input signal so as to compensate for said input stage mirroring structure's compression.

22. The input stage of claim 4, further comprising a input stage mirroring structure connected between first and second supply voltages and which receives said currents $I_{D1+}$, $I_{D1-}$, $I_{D2+}$ and $I_{D2-}$ and produces an output current in response, said input stage mirroring structure comprising:
  first and second degeneration resistors connected between said first supply voltage and fourth and fifth nodes, respectively, said currents $I_{D1+}$ and $I_{D1-}$ connected to said fourth and fifth nodes, respectively;
  third and fourth degeneration resistors connected between said second supply voltage and sixth and seventh nodes, respectively, said currents $I_{D2+}$ and $I_{D2-}$ connected to said sixth and seventh nodes, respectively;
  a first current mirror connected between said fourth and fifth nodes, comprising:
    a first diode-connected input transistor having its emitter connected to said fifth node,
    a first current mirror output transistor having its emitter connected to said fourth node, the bases of said first current mirror transistors connected together;
  a second current mirror connected between said sixth and seventh nodes, comprising:
    a second diode-connected input transistor having its emitter connected to said sixth node,
    a second current mirror output transistor having its emitter connected to said seventh node, the bases of said second current mirror transistors connected together;
  a bias current source connected between the collector of said first current mirror output transistor at an eighth node and the collector of said second current mirror output transistor at a ninth node;
  an output node;
  a PNP output transistor having its base connected to said eighth node, its emitter connected to the collector of said first diode-connected input transistor, and its collector connected to said output node; and
  a NPN output transistor having its base connected to said ninth node, its emitter connected to the collector of said second diode-connected input transistor, and its collector connected to said output node,
  the current at said output node being said output current.

23. The input stage of claim 4, further comprising a input stage mirroring structure connected between first and second supply voltages and which receives said currents $I_{D1+}$, $I_{D1-}$, $I_{D2+}$ and $I_{D2-}$ and produces an output current $I_{out}$ in response, said input stage mirroring structure comprising:
  first and second degeneration resistors connected between said first supply voltage and fourth and fifth nodes, respectively;
  third and fourth degeneration resistors connected between said second supply voltage and sixth and seventh nodes, respectively;
  a first current mirror circuit connected between said fourth and fifth nodes, comprising:
    a first diode-connected input transistor having its emitter connected to said fifth node,
    a first current mirror output transistor having its emitter connected to said fourth node, the bases of said first current mirror transistors connected together;
  a second current mirror connected between said sixth and seventh nodes, comprising:
    a second diode-connected input transistor having its emitter connected to said sixth node,
    a second current mirror output transistor having its emitter connected to said seventh node, the bases of said second current mirror transistors connected together;
  a third diode-connected transistor having its emitter connected to the collector of said first current mirror output transistor at an eighth node and its base and collector connected together;
  a fourth diode-connected transistor having its emitter connected to the collector of said second current mirror output transistor at a ninth node and its base and collector connected together;
  a bias current source connected between the collector of said third diode-connected transistor and the collector of said fourth diode-connected transistor;
  an output node;
  a PNP output transistor having its base connected to the base and collector of said third diode-connected transistor, its emitter connected to the collector of said first diode-connected input transistor at a tenth node, and its collector connected to said output node; and
  a NPN output transistor having its base connected to the base and collector of said fourth diode-connected transistor, its emitter connected to the collector of said second diode-connected input transistor at an eleventh node, and its collector connected to said output node;
  said currents $I_{D1+}$ and $I_{D1-}$ connected to said eighth and tenth nodes, respectively;
  said currents $I_{D2+}$ and $I_{D2-}$ connected to said eleventh and ninth nodes, respectively;
  the current at said output node being said output current, said input stage mirroring structure arranged such that $I_{out}$ is given by:

$$I_{out} = I_{D2+} + I_{D1+} - I_{D2-} - I_{D1-}.$$

24. A common mode linearized input stage, comprising:
  a differential input terminal $V_{in+}$;
  a differential input terminal $V_{in-}$, said differential input terminals connected to receive a differential input signal;
  first and second NPN transistors arranged as a differential transistor pair, the bases of said first and second NPN transistors connected to $V_{in+}$ and $V_{in-}$, respectively, the emitters of said first and second NPN transistors connected together at a first node, and the collectors of said first and second NPN transistors conducting respective currents $I_{D1+}$ and $I_{D1-}$ in response to said differential input signal;
  first and second PNP transistors arranged as a differential transistor pair, the bases of said first and second PNP transistors connected to $V_{in-}$ and $V_{in+}$, respectively, the emitters of said first and second PNP transistors connected together at a second node, and the collectors of said first and second PNP transistors conducting respective currents $I_{D2+}$ and $I_{D2-}$ in response to said differential input signal,
  said first and second NPN transistors and said first and second PNP transistors each having an emitter size of 1;
  a first tail current source connected to said first node to provide a first tail current $I_{tail1}$ to said NPN differential transistor pair;

a second tail current source connected to said second node to provide a second tail current $I_{tail2}$ to said PNP differential transistor pair;

a PNP diversion transistor having its base connected to said first node, its collector coupled to said first tail current source, and its emitter connected to a third node; and a NPN diversion transistor having its base connected to said second node, its collector coupled to said second tail current source, and its emitter connected to said third node, said PNP and NPN diversion transistors each having an emitter size of A, such that said PNP and NPN diversion transistors conduct and thereby divert said first and second tail currents from said NPN and PNP differential transistor pairs by a scaling ratio of A when said differential input signal is zero;

said input stage arranged such that the current $I_{D1+}$ conducted by said first NPN transistor is given by:

$$I_{D1+} = \frac{e^{\alpha}}{e^{\alpha} + A + e^{-\alpha}} * I_{1(max)}$$

the current conducted by said second NPN transistor is given by:

$$I_{D1-} = \frac{e^{-\alpha}}{e^{\alpha} + A + e^{-\alpha}} * I_{1(max)}$$

and the current $I_{div}$ conducted by said PNP and NPN diversion transistors is given by:

$$I_{div} = \frac{A}{e^{\alpha} + A + e^{-\alpha}}$$

where $\alpha$ is given by:

$$\alpha = \frac{V_{in+} - V_{in-}}{2 * V_t},$$

where $V_t$ is the thermal voltage $$\frac{kT}{q},$$

and the transconductance $G_m$ of the input stage is given by:

$$G_m = \frac{2A * \cosh\alpha + 4}{(2 * \cosh\alpha + A)^2} \cdot \frac{d\alpha}{d(V_{in+} - V_{in-})} \cdot I_{(max)} \text{ assuming}$$

$$I_{1(max)} = I_{2(max)} = I_{(max)}.$$

25. The input stage of claim 24, further comprising a input stage mirroring structure connected between first and second supply voltages and which receives said currents $I_{D1+}$, $I_{D1-}$, $I_{D2+}$ and $I_{D2-}$ and produces an output current in response, said input stage mirroring structure comprising:

first and second degeneration resistors connected between said first supply voltage and fourth and fifth nodes, respectively, said currents $I_{D1+}$ and $I_{D1-}$ connected to said fourth and fifth nodes, respectively;

third and fourth degeneration resistors connected between said second supply voltage and sixth and seventh nodes, respectively, said currents $I_{D2+}$ and $I_{D2-}$ connected to said sixth and seventh nodes, respectively;

a first current mirror connected between said fourth and fifth nodes, comprising:
 a first diode-connected input transistor having its emitter connected to said fifth node,
 a first current mirror output transistor having its emitter connected to said fourth node, the bases of said first current mirror transistors connected together;

a second current mirror connected between said sixth and seventh nodes, comprising:
 a second diode-connected input transistor having its emitter connected to said sixth node,
 a second current mirror output transistor having its emitter connected to said seventh node, the bases of said second current mirror transistors connected together;

a bias current source connected between the collector of said first output transistor at an eighth node and the collector of said second output transistor at a ninth node;

an output node;

a PNP output transistor having its base connected to said eighth node, its emitter connected to the collector of said first diode-connected input transistor, and its collector connected to said output node; and a NPN output transistor having its base connected to said ninth node, its emitter connected to the collector of said second diode-connected input transistor, and its collector connected to said output node, the current at said output node being said output current.

26. The input stage of claim 25, wherein said input stage mirroring structure has an associated compression characteristic such that said output current does not vary linearly with said currents $I_{D1+}$, $I_{D1-}$, $I_{D2+}$ and $I_{D2-}$, wherein the value of A is selected to provide a transconductance $G_m$ for said input stage that decompresses said differential input signal so as to compensate for said input stage mirroring structure's compression.

27. A common mode linearized input stage, comprising:
first and second supply voltages;
a differential input terminal $V_{in+}$;
a differential input terminal $V_{in-}$, said differential input terminals connected to receive a differential input signal;

first and second NPN transistors arranged as a differential transistor pair, the bases of said first and second NPN transistors connected to $V_{in+}$ and $V_{in-}$, respectively, the emitters of said first and second NPN transistors connected together at a first node, and the collectors of said first and second NPN transistors conducting respective currents in response to said differential input signal;

first and second PNP transistors arranged as a differential transistor pair, the bases of said first and second PNP transistors connected to $V_{in-}$ and $V_{in+}$, respectively, the emitters of said first and second PNP transistors connected together at a second node, and the collectors of said first and second PNP transistors coupled to said second supply voltage;

a first tail current source connected between said first node and said second supply voltage to provide a first tail current $I_{tail1}$ to said NPN differential transistor pair;

a second tail current source connected between said first supply voltage and said second node to provide a second tail current $I_{tail2}$ to said PNP differential transistor pair;

a PNP diversion transistor having its base connected to said first node, its collector coupled to said first tail current source, and its emitter connected to a third node; and a NPN diversion transistor having its base connected to said second node, its collector coupled to said first supply voltage, and its emitter connected to said third node, such that said PNP and NPN diversion transistors conduct and thereby divert said first tail current from said NPN differential transistor pair when said differential input signal is zero.

28. An amplifier, comprising:

an input stage; and an input stage mirroring structure;

said input stage comprising:

a differential input terminal $V_{in+}$;

a differential input terminal $V_{in-}$, said differential input terminals connected to receive a differential input signal;

first and second NPN transistors arranged as a differential transistor pair, the bases of said first and second NPN transistors connected to $V_{in+}$ and $V_{in-}$, respectively, the emitters of said first and second NPN transistors connected together at a first node, and the collectors of said first and second NPN transistors conducting respective currents $I_{D1+}$ and $I_{D1-}$ in response to said differential input signal;

first and second PNP transistors arranged as a differential transistor pair, the bases of said first and second PNP transistors connected to $V_{in-}$ and $V_{in+}$, respectively, the emitters of said first and second PNP transistors connected together at a second node, and the collectors of said first and second PNP transistors conducting respective currents $I_{D2+}$ and $I_{D2-}$ in response to said differential input signal;

a first tail current source connected to said first node to provide a first tail current $I_{tail1}$ to said NPN differential transistor pair;

a second tail current source connected to said second node to provide a second tail current $I_{tail2}$ to said PNP differential transistor pair;

a tail current modulation circuit which generates complementary output currents $I_{in1}$, $I_{in2}$ as a function of the difference between the voltages at said first and second nodes;

said first tail current source arranged to generate said first tail current $I_{tail1}$ as a function of $I_{in1}$, and said second tail current source arranged to generate said second tail current $I_{tail2}$ as a function of $I_{in2}$, said tail current modulation circuit and said first and second tail current sources arranged such that the magnitudes of tail currents $I_{tail1}$ and $I_{tail2}$ increase with an increasing differential input signal;

said input stage mirroring structure connected between first and second supply voltages and which receives said currents $I_{D1+}$, $I_{D1-}$, $I_{D2+}$ and $I_{D2-}$ and produces an output current in response, said input stage mirroring structure comprising:

a first current mirror circuit having an input and output, said differential output currents $I_{D1+}$ and $I_{D1-}$ coupled to first current mirror circuit at third and fourth nodes, respectively, said first current mirror circuit arranged such that $I_{D1+}$ and $I_{D1-}$ inject offset current into an otherwise balanced current mirror such that the current at said first current mirror circuit's output varies only when $I_{D1+}$ and $I_{D1-}$ are unequal;

a second current mirror circuit having an input and output and complementary to said first current mirror circuit, said differential output currents $I_{D2+}$ and $I_{D2-}$ coupled to second current mirror circuit at fifth and sixth nodes, respectively, said second current mirror circuit arranged such that $I_{D2+}$ and $I_{D2-}$ inject offset current into an otherwise balanced current mirror such that the current at said second current mirror circuit's output varies only when $I_{D2+}$ and $I_{D2-}$ are unequal;

a single floating current source connected between the inputs of said first and second current mirror circuits, the outputs of said first and second current mirror circuits coupled to an output node, the current at said output node being said output current;

such that noise due to said floating current source is correlated for the two current mirror circuits such that its noise sums to zero at said output node, said input stage connected to said mirroring structure in a balanced fashion such that a change in $I_{tail1}$ shifts the voltages at said third and fourth nodes by equal amounts and a change in $I_{tail2}$ shifts the voltages at said fifth and sixth nodes by equal amounts without changing said output current, thereby rejecting common mode noise.

* * * * *